United States Patent
Lerner et al.

(10) Patent No.: US 7,256,132 B2
(45) Date of Patent: Aug. 14, 2007

(54) SUBSTRATE CENTERING APPARATUS AND METHOD

(75) Inventors: Alexander Lerner, San Jose, CA (US); Avi Tepman, Cupertino, CA (US); Donald Olgato, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 345 days.

(21) Appl. No.: 10/631,650

(22) Filed: Jul. 31, 2003

(65) Prior Publication Data

US 2004/0047720 A1 Mar. 11, 2004

Related U.S. Application Data

(60) Provisional application No. 60/399,766, filed on Jul. 31, 2002.

(51) Int. Cl.
*H01L 21/302* (2006.01)
*H01L 21/461* (2006.01)

(52) U.S. Cl. ........... 438/716; 118/500

(58) Field of Classification Search ........ 438/716, 438/782, 973; 118/500, 728, 730
See application file for complete search history.

(56) References Cited

U.S. PATENT DOCUMENTS 4,789,294 A * 12/1988 Sato et al. ......... 414/416.03
5,421,893 A * 6/1995 Perlov .................. 118/725
6,454,516 B1 * 9/2002 Yamagishi ............. 414/754
6,555,164 B1 * 4/2003 Yudovsky .............. 427/248.1
6,592,675 B2 * 7/2003 Nishikawa .............. 118/730
6,629,788 B2 * 10/2003 Miranda et al. ........... 400/59
6,685,815 B2 * 2/2004 Kovarsky ............... 205/98
6,774,550 B2 * 8/2004 Kanarov et al. ........ 313/360.1
6,827,092 B1 * 12/2004 Smith et al. ............ 134/149

FOREIGN PATENT DOCUMENTS

JP     60257134 A2    12/1985
JP      4030553 A2     2/1992

* cited by examiner

*Primary Examiner*—Phuc T. Dang
(74) *Attorney, Agent, or Firm*—Dugan & Dugan, PC (57) ABSTRACT

A semiconductor substrate centering mechanism includes a plurality of substrate support pins, each pin having a top surface. The top surfaces of the pins define a plane in which the substrate is supported. Each pin has a tab mounted eccentrically at the top surface of the pin. The tabs extend upwardly relative to the top surfaces of the pins. The centering mechanism further includes a pin rotation mechanism adapted to rotate each pin. The pin rotation mechanism rotates the pins between a first position in which the tabs define an envelope that is larger than a circumference of the substrate and a second position in which the tabs define a centered position for the substrate. A telescoping arrangement of nesting shield segments may also be provided for each pin to prevent processing fluid from reaching a shaft of the pin. In one aspect the centering mechanism is coupled to a substrate support of a substrate processing location, and thus allows a substrate to be centered as it is lowered to the processing location.

30 Claims, 5 Drawing Sheets

SUBSTRATE CENTERING APPARATUS AND METHOD

FIELD OF THE INVENTION

The present application claims priority from U.S. Provisional Patent Application Ser. No. 60/399,766, filed Jul. 31, 2002, and titled "Substrate Centering Apparatus and Method", which is hereby incorporated by reference herein in its entirety.

FIELD OF THE INVENTION

The present invention is concerned with semiconductor manufacturing, and is more particularly concerned with handling of substrates used during semiconductor device manufacturing such as semiconductor substrates, glass plates or the like.

BACKGROUND OF THE INVENTION

According to conventional practices, semiconductor devices are formed on substrates, which are sometimes referred to as wafers. The substrates are thin and disk-shaped and are usually formed of silicon.

Semiconductor manufacturing requires that a number of processes, such as deposition, etching, photolithography, chemical-mechanical polishing and edge cleaning be performed with respect to a substrate. Typically the various processes are performed in various locations or chambers and accordingly the substrate must be transported from one location to another. It is conventional to employ automatic transport devices, such as robotic devices, to transport the substrate from one processing location to another.

Although automatic transport of substrates is designed to be precise and repeatable, it is known that inaccuracies in automatic placement and positioning of substrates do occur. When a substrate is placed inaccurately, processing of the substrate, such as edge cleaning, may be adversely affected. A substrate that has been inaccurately placed may be mishandled and even dropped and damaged, by a device to which the substrate is handed off. Accordingly, it is known to include in substrate-handling devices a mechanism to precisely position or center a substrate relative to a device that is handing off or receiving a substrate. Examples of prior art substrate centering mechanisms are disclosed in published Japanese Patent Application Nos. SHO 60-257134 and HEI 4-30553.

In another conventional arrangement, a centering ring is provided. The substrate is placed on the centering ring and slides down to a centered position defined by the centering ring. However, the sliding of the substrate on the centering ring may generate particles which may contaminate the substrate.

Prior art substrate centering mechanisms may be undesirably complicated and/or may fail to reliably and repeatably center substrates and/or may increase the possibility of substrate contamination. Accordingly, it would be desirable to provide an improved substrate centering mechanism.

SUMMARY OF THE INVENTION

Inventive substrate lift pins lift a substrate off of a substrate handler blade, lower the substrate onto a substrate support and lift the substrate from the substrate support after processing is complete. An inventive feature of the pins is the ability to center a substrate. Thus a substrate may be centered as it is lowered and/or lifted from the substrate support, saving time otherwise required by a separate centering step.

Centering may be accomplished via an eccentrically positioned substrate retaining tab located on the top of each pin. In addition to being able to lift and lower each pin is rotatable, such that the substrate guide tabs may rotate from a substrate receiving position wherein the tabs define an envelope greater than that of the substrate, to a substrate centering position wherein the tabs define a circumference equal to that of the substrate, and centered with respect to the substrate chuck. In one aspect the pins rotate about a longitudinal axis.

In one aspect, inventive lift pins are able to selectively lift and lower without rotation, so as to hold the substrate in a centered position. To accomplish selective rotation, the pins may comprise a vertical spline or the like mounted to slide through a guide configured to allow vertical motion of the spline while prohibiting rotational motion of the spline relative to the guide.

To provide selective rotation the spline guides are each mounted to a rotation mechanism and the rotation mechanisms are in turn mounted to a central transmission mechanism. Rotation of the central transmission mechanism clockwise and counterclockwise causes the guides and the splines coupled therethrough to rotate clockwise and counterclockwise between the substrate receiving position and the substrate centering position. Thus rotation of the central transmission mechanism may control rotation of each pin, and lifting and lowering of a pin support to which the pins are coupled, simultaneously lifts/lowers each pin. Elevation and rotation functions may thereby be separately and more precisely controlled yet may occur simultaneously.

In a further aspect, an inventive apparatus for substrate processing is provided. The apparatus comprises a substrate support of a processing location (e.g., a location where the substrate surface is treated) having the inventive lift pin system coupled thereto. Preferably the substrate support is adapted to chuck a substrate, and the apparatus is adapted for substrate bevel cleaning.

In yet another aspect, to prevent fluids from running down the lift pin and thereby leaking from the processing chamber, a lift pin skirt is provided. The pin skirt may comprise a plurality of graduated shield segments having outer perimeters which decrease as they approach a point where the pin exits the processing chamber. Each shield segment may have a lip on which the next sequentially smaller perimeter ring is suspended when the pin is in an extended position (e.g., when the pin is elevated for substrate transfer).

The methods and apparatus of the present invention may provide highly repeatable and reliable centering and positioning of a substrate. Furthermore, the inventive methods and apparatus may allow for a substrate to be centered simultaneously with lifting or lowering the substrate to save time and improve efficiency in handling and transporting the substrate. Also, the centering of the substrate may be performed at the top or bottom of a stroke of substrate support/lift pins.

Other objects, features and advantages of the present invention will become more fully apparent from the following detailed description of exemplary embodiments, the appended claims and the accompanying drawings.

DETAILED DESCRIPTION

In accordance with a first aspect of the invention, a substrate chuck (i.e., a substrate support that applies a force such as a vacuum or electrostatic force to a front or back surface of a substrate to thereby hold the substrate) has a plurality of substrate lift pins adapted to selectively extend from the plane of the substrate chuck to a substrate exchange location and to selectively rotate to bring tabs extending upwardly from the pins into contact with the edge of a substrate supported on the pins, to thereby urge the substrate into a centered position. Thus, centering of the substrate may be performed while the substrate is being lowered to the substrate chuck.

Also, each lift pin optionally may be equipped with a skirt formed of telescoping segments (e.g., cylinders). The skirt prevents substrate processing fluid from reaching and running down the lift pin and thereby leaking from the processing chamber via the aperture through which the lift pin enters the chamber.

An exemplary substrate centering mechanism provided in accordance with the invention is described with reference to FIGS. 1A-3.

Figure 1A:
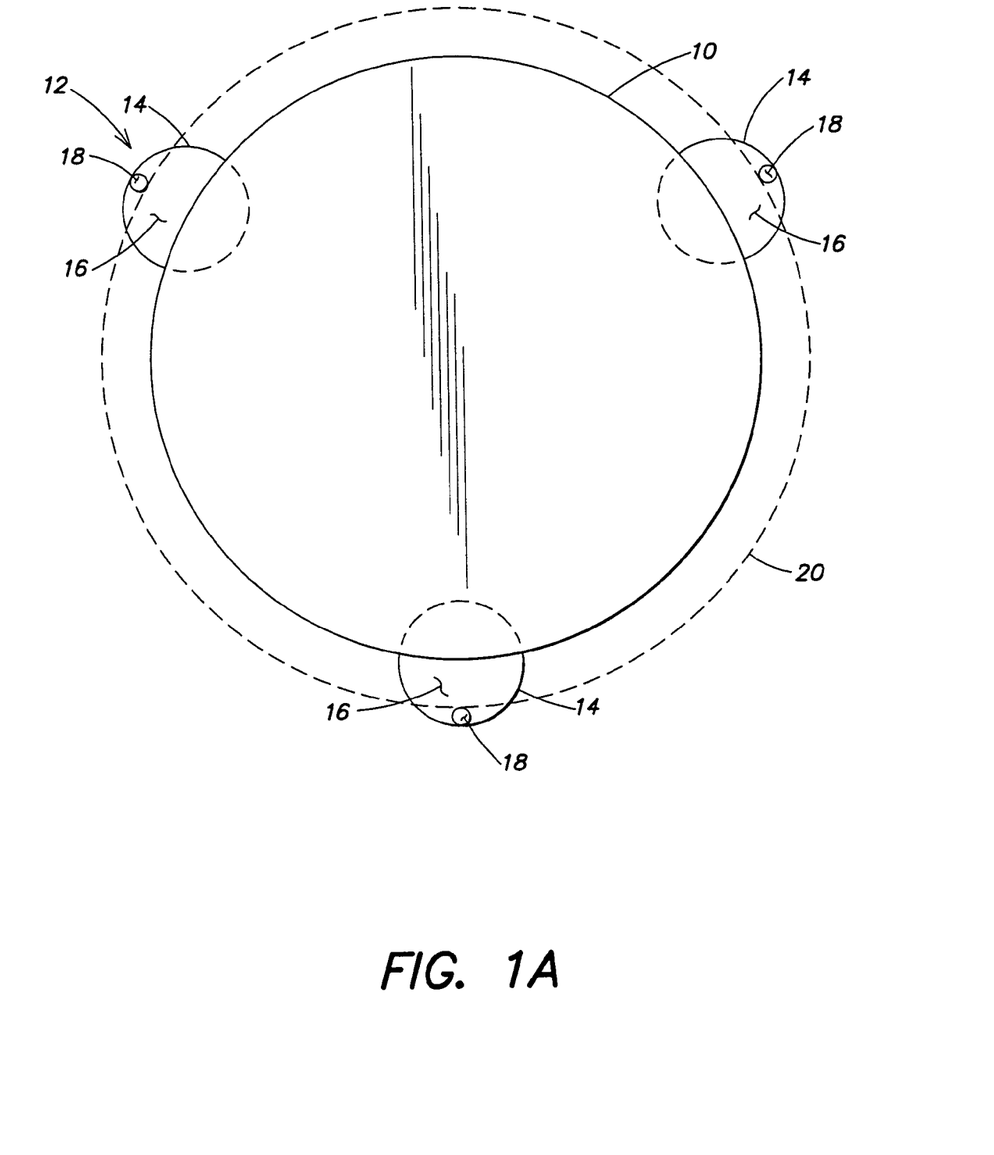
FIG. 1A is a schematic plan view showing a substrate centering mechanism in a first position.
Figure 1B:
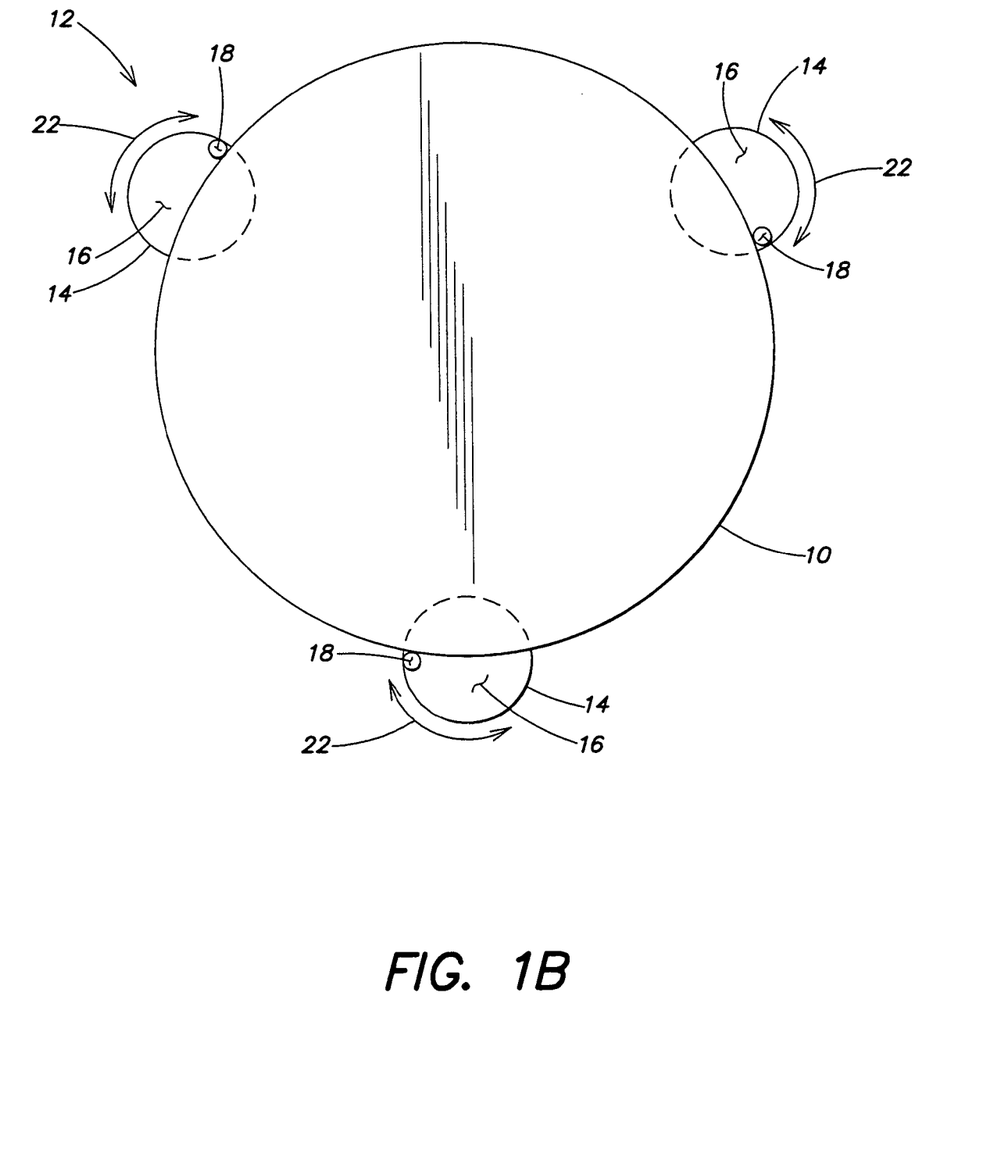
FIG. 1B is a view similar to FIG. 1A, showing the substrate centering mechanism in a second position which defines a centered position for the substrate.

FIGS. 1A and 1B are schematic plan views of the inventive substrate centering mechanism. Reference numeral 10 indicates a substrate or wafer to be centered by the inventive centering mechanism. Reference numeral 12 generally indicates the inventive substrate centering mechanism. The substrate centering mechanism 12 includes a plurality of substrate support pins 14. Each of the substrate support pins 14 has a respective top surface 16. The substrate 10 is supported on the top surfaces 16 of the substrate support pins 14 either on the top surface itself, or on a projection that extends therefrom so as to minimize contact with the substrate (e.g., a radiused projection).

Each of the substrate support pins 14 has a tab 18 that is mounted at the respective top surface 16 of the substrate support pin 14, and extends upwardly from the top surface 16. The substrate support pins 14 are rotatable (e.g., about respective longitudinal axes of the substrate support pins 14), between positions shown in FIG. 1A and positions shown in FIG. 1B, and the tabs 18 are eccentrically positioned with respect to the support pins' axes of rotation such that when the substrate support pins 14 are in the positions shown in FIG. 1A, the respective tabs 18 of the substrate support pins 14 define an envelope 20 that is larger than the circumference of the substrate 10, and when the substrate support pins 14 are in the positions shown in FIG. 1B, the tabs 18 of the substrate support pins 14 define a centered position for the substrate 10. For example, the substrate support pins 14 may be rotatable substantially 90°, as indicated by arrows 22 in FIG. 1B, between the positions of FIG. 1A and the positions of FIG. 1B. After a substrate 10 has been placed on the substrate support pins 14 when the substrate support pins 14 are in the positions shown in FIG. 1A, the substrate support pins 14 are rotated to the position shown in FIG. 1B. In the course of such rotation, one or more of the tabs 18 may contact the substrate 10 to apply a horizontal force to the edge of the substrate 10 to move the substrate 10 to the centered position defined by the tabs 18 when positioned as shown in FIG. 1B.

Figure 2:
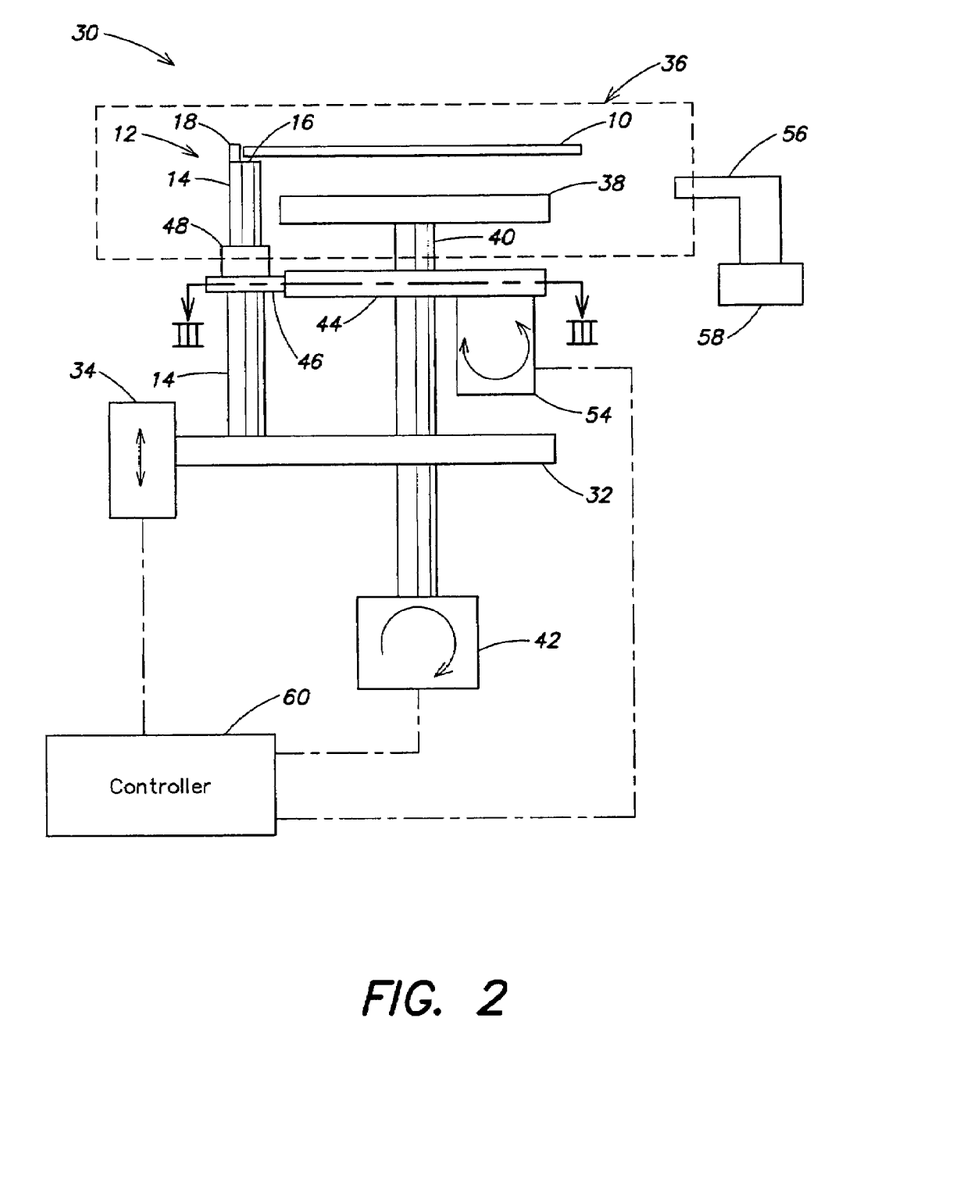
FIG. 2 is a schematic cross-sectional view of a substrate processing apparatus that includes the substrate centering mechanism of FIGS. 1A and 1B.

FIG. 2 is a schematic cross-sectional view of a substrate processing apparatus 30 that includes the substrate centering mechanism 12 of FIGS. 1A-1B. The substrate processing apparatus 30 may be, for example, a substrate bevel cleaning apparatus.

The substrate processing apparatus 30 may include a lift hoop 32 (which need not be circular) on which the substrate support pins 14 are supported. (To simplify the drawing, only one of the plural substrate support pins 14 is shown in FIG. 2.) The exemplary lift hoop 32 is mounted on a lift/lower mechanism 34 which may include a motor (not separately shown) and a lead screw (not separately shown) or the like. The lift/lower mechanism 34 is adapted to lift and lower the lift hoop 32. The substrate support pins 14 lift and lower with the lift hoop 32. The substrate support pins 14 are adapted to support the substrate 10 in a processing chamber 36 and are adapted to lift and lower the substrate 10 from and to a chuck 38 (e.g., a vacuum or electrostatic chuck, or the like) that is disposed in the processing chamber 36. The chuck 38 is mounted for rotation on a spindle 40. A spindle rotation mechanism 42 (e.g., a motor) is coupled to the spindle 40 to rotate the spindle 40.

Figure 3:
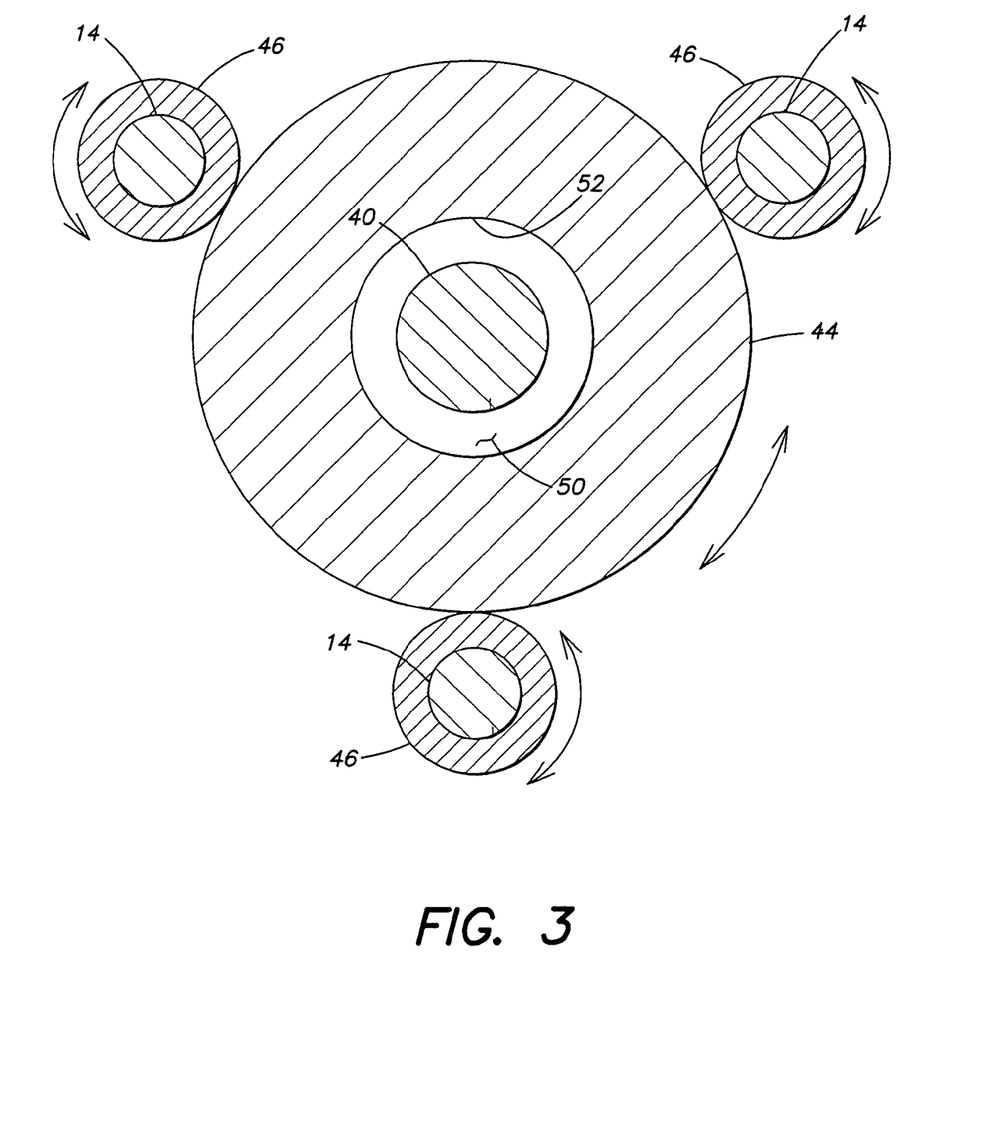
FIG. 3 is a schematic horizontal cross-sectional view of the substrate processing apparatus taken at line III-III in FIG. 2.

The centering mechanism 12 includes a central transmission mechanism such as a central gear 44 which is coupled to each substrate support pin 14 via a pin rotation mechanism (e.g., via a respective sprocket 46 and pin coupling mechanism 48 as described further below). Transmission mechanisms other than gears and sprockets (e.g., any conventional mechanism such as belts, pulleys, chains, cables, cam/follower arrangements and the like) may be employed. FIG. 3 is a schematic cross-sectional view taken at line III-III of FIG. 2, showing an exemplary central transmission mechanism coupled to a plurality of pin rotation mechanisms, specifically, in the example of FIG. 3, the central gear 44 is meshed with a plurality of sprockets 46 (e.g., three sprockets as indicated in FIG. 3). Each sprocket 46 may be concentrically mounted with respect to a respective one of the substrate support pins 14. The central gear 44 may be concentrically mounted with respect to the spindle 40 via a bearing 50. The central gear 44 may include an aperture 52 formed concentrically in the central gear 44 to accommodate the bearing 50 and the spindle 40 which may pass through the aperture 52. A central rotation mechanism 54 (FIG. 2) is coupled to the central gear 44 and is adapted to rotate the central gear 44.

As shown, the pin coupling mechanism 48 associated with each substrate support pin 14 couples the respective sprocket 46 to the respective substrate support pin 14 such that when the sprocket 46 rotates the substrate support pin 14 rotates as well, while the substrate support pin 14 remains free to be lifted and lowered relative to the sprocket 46. In one embodiment, each substrate support pin 14 may include a vertical spline and the pin coupling mechanism 48 may include a guide through which the vertical spline may slide, while being prohibited from rotating relative to the sprocket 46. Each spline may include vertical grooves which are engaged by the guide so as to prevent the spline from rotating relative to the sprocket 46. Thus, the spline rotates only when the guide rotates. When the sprocket 46 is rotated, the guide rotates, causing the spline and the substrate support pin 14 to rotate.

Assuming that the substrate processing apparatus 30 is a substrate bevel cleaning apparatus, the substrate processing apparatus includes a cleaning fluid dispenser arm 56 which is disposed in the processing chamber 36 and is adapted to dispense a cleaning fluid to an edge of a substrate 10 while the substrate 10 is supported on and rotated by the chuck 38. A cleaning fluid source 58 supplies cleaning fluid to the cleaning fluid dispenser arm 56.

The substrate processing apparatus 30 also includes a controller 60 that is operatively coupled to the lift/lower mechanism 34, the spindle rotation mechanism 42 and the central rotation mechanism 54.

In operation, the substrate support pins 14 are initially in the position indicated in FIG. 1A, with the tabs 18 defining the larger envelope 20. A substrate handling robot (not shown) carries a substrate 10 into the processing chamber 36. The controller 60 controls the lift/lower mechanism 34 to raise the lift hoop 32, thereby lifting the substrate support pins 14 so that the top surfaces 16 of the substrate support pins 14 contact the substrate 10 to lift the substrate 10 off the substrate handling robot. The substrate handling robot withdraws from the processing chamber 36. Then the controller 60 controls the lift/lower mechanism 34 to lower the lift hoop 32, thereby lowering the substrate support pins 14 with the substrate 10 supported thereon.

While the substrate 10 is being lowered by the substrate support pins 14, the controller 60 may control the central rotation mechanism 54 to rotate the central gear 44 such that the substrate support pins 14 are rotated (via the sprockets 46 and the sprocket coupling mechanisms 48) around the longitudinal axes of the substrate support pins 14 from the position shown in FIG. 1A to the position shown in FIG. 1B, in which the tabs 18 define the centered position for the substrate 10. If the substrate 10 had been placed off center in the larger envelope 20 (FIG. 1A), then one or more of the tabs 18 contact the edge of the substrate 10 during the rotation of the substrate support pins 14 to urge the substrate 10 into the centered position. The rotation of the substrate support pins 14 may be to an angular extent of 90°, in one embodiment. The rotation of the substrate support pins 14 may end with all three of the tabs 18 in contact with the edge of the substrate 10 and exerting a slight inward force on the substrate 10. The substrate support pins 14, or at least the tabs 18, may have a degree of flexibility (e.g., may be comprised of a plastic material such as polyetheretherketone (PEEK) or a similar material and/or may be configured with a length to width relationship that allows flexibility or may be mounted so as to be slightly flexible.) Thus the pins may accommodate the simultaneous contact of the tabs 18 with the substrate 10, without chipping or gouging the substrate 10. The controller 16 may then optionally control the central rotation mechanism 54 to rotate the central gear 44 by a small amount in a reverse direction, to rotate the substrate support pins 14 away from the position of FIG. 1B (e.g., by less than 1 degree), to bring the tabs 18 out of contact with the substrate 10, thereby leaving the substrate 10 in the centered position, while relieving the forces that had been applied to the substrate 10 by the tabs 18.

In one embodiment, the centering of the substrate 10 and the optional releasing of the substrate 10 from the tabs 18 after centering occur while the wafer 10 is being lowered toward the chuck 38. Alternatively, however, the centering operation and the optional release of the substrate 10 from the tabs 18 may occur before lowering, i.e. at the substrate exchange location. As another alternative, the centering of the substrate 10 and release of the substrate 10 from the tabs 18 may occur after the substrate 10 has been lowered onto the chuck 38. Centering of a substrate positioned on the chuck 38, although possible, is less desirable, as the substrate 10 may slide on the top surface of the chuck 38, and may thereby generate particles.

In any case, whether before, after or during centering, the substrate 10 is lowered by the substrate support pins 14 onto the chuck 38. Force (e.g., vacuum or electrostatic) may then be applied so that the substrate 10 is held on the chuck 38. The controller activates the spindle rotation mechanism 42 so that the spindle 40 and the chuck 38, with the substrate 10 thereon, are continuously rotated. While the substrate 10 is being rotated, the cleaning fluid dispenser arm 46 may dispense a cleaning fluid to the bevel of the substrate 10 to clean the bevel of the substrate 10. When cleaning is complete, dispensing of cleaning fluid by the cleaning fluid dispenser arm ceases and the controller 60 controls the spindle rotation mechanism 42 to stop rotating the chuck 38 and the substrate 10. When rotation of the substrate 10 has stopped, the chucking force is released, so that the substrate 10 is no longer held by vacuum on the chuck 38. The controller 60 then controls the lift/lower mechanism to raise the lift hoop 32 so that the substrate support pins 14 lift the substrate 10 off the chuck 38 and raise the substrate 10 to a hand-off position. The substrate handling robot (not shown) then enters the processing chamber 36 and the substrate support pins 14 lower the substrate 10 onto the substrate handling robot. The substrate handling robot then withdraws, carrying the substrate 10 out of the processing chamber 36.

At some point after placement of the substrate 10 on the chuck 38 (e.g., immediately after placement, just prior to receipt of a new wafer in the hand off position, etc.), the controller 60 causes the gear rotation mechanism to operate so as to rotate the substrate support pins to the position shown in FIG. 1A. Thus, the substrate support pins 14 are positioned to receive the next substrate to be processed in the processing chamber.

The substrate centering mechanism of the present invention provides for reliable and repeatable positioning of a substrate at a pre-defined centered position. Moreover, centering can be performed at a substrate exchange location at which the substrate is placed on the support pins, at a position where the support pins place the substrate on a wafer support of a processing location, or at any position there between. Specifically, the substrate may be centered as the substrate is being raised or lowered. Because the centering operation may overlap with raising or lowering the substrate to and from the process location (e.g., vacuum chuck, electrostatic chuck, fly wheel, stationary pedestal for supporting a substrate during a deposition or etch process, etc.), efficient operation is promoted.

Figure 4A:
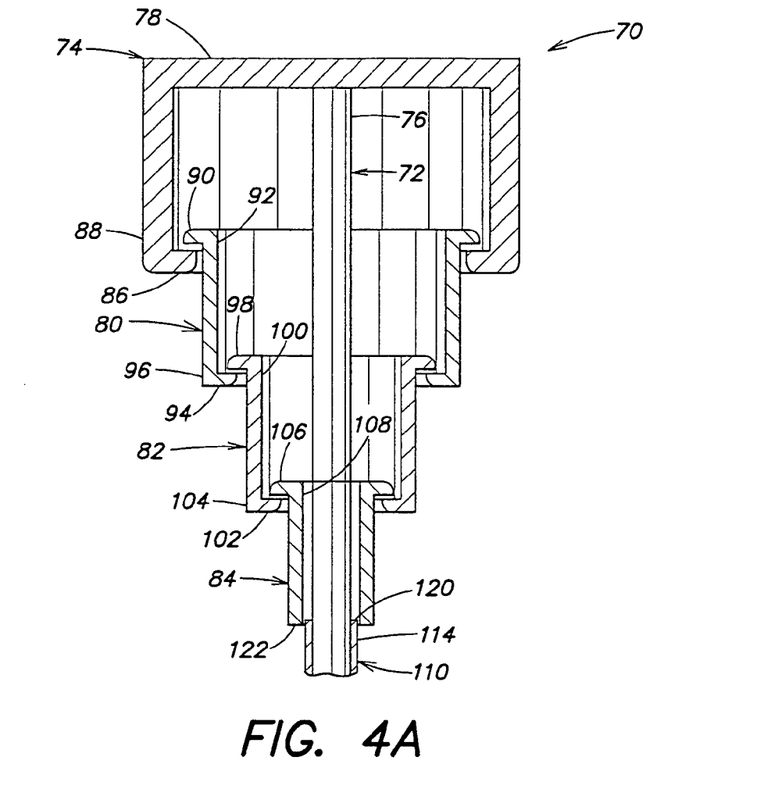
FIG. 4A is a schematic cross-sectional view of a lift pin assembly provided according to another aspect of the invention.
Figure 4B:
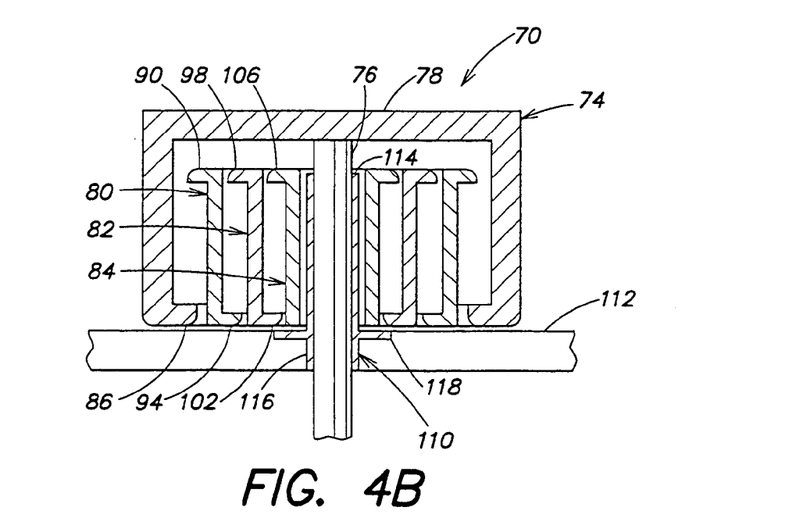
FIG. 4B is a schematic cross-sectional view showing the lift pin assembly of FIG. 4A in a retracted condition.

A lift pin assembly for deterring fluid leaks is described with reference to FIGS. 4A and 4B. FIG. 4A is a schematic cross-sectional view showing an inventive lift pin assembly 70 in an extended condition, and FIG. 4B is a schematic cross-sectional view, showing the lift pin assembly 70 in a retracted condition.

The lift pin assembly 70 includes a vertically-oriented shaft 72. A first shield segment 74 is mounted at a top end 76 of the shaft 72 (e.g., via a closed top 78 of the first shield segment 74). The top 78 of the first shield segment 74 may be integrated with the top surface 16 of the substrate support pin 14 shown in FIGS. 1A, 1B and 2. Accordingly, the top 78 of the first shield segment 74 may have a centering tab (not shown in FIGS. 4A and 4B) like the tabs 18 shown in FIGS. 1A, 1B and 2 and/or may include a projection for minimizing contact with a substrate.

The lift pin assembly 70 also includes a second shield segment 80 which is adapted to be supported by the first shield segment 74 when the lift pin assembly 70 is in its extended condition shown in FIG. 4A. The lift pin assembly 70 may further include a third shield segment 82 that is adapted to be supported by the second shield segment 80 when the lift pin assembly 70 is in the extended condition shown in FIG. 4A, and a fourth shield segment 84 that is adapted to be supported by the third shield segment 82 when the lift pin assembly is in the extended condition shown in FIG. 4A. Although four shield segments are shown, it will be understood that the inventive assembly may be implemented with any two or more shield segments.

Each successive shield segment decreases in outer perimeter. For example, assuming each shield segment is cylindrical, the second shield segment 80 has a smaller diameter than the first shield segment 74, so that the second shield segment 80 can fit inside the first shield segment 74 when the lift pin assembly is in the retracted position shown in FIG. 4B. Also, the third shield segment 82 has a smaller diameter than the second shield segment 80, so that the third shield segment 82 can fit inside the second shield segment 80 (and inside the first shield segment 74) when the lift pin assembly 70 is in the retracted position shown in FIG. 4B. Further, the fourth shield segment 84 has a smaller diameter than the third shield segment 82 so that the fourth shield segment 84 can fit inside the third shield segment 82 (and inside the second shield segment 80 and the first shield segment 74) when the lift pin assembly 70 is in the retracted position shown in FIG. 4B.

The first shield segment 74 may have an inwardly extending lip 86 at a lower end 88 of the first shield segment 74. The second shield segment 80 may have an outwardly extending lip 90 at an upper end 92 of the second shield segment 80. The inwardly extending lip 86 of the first shield segment 74 may be adapted to engage the outwardly extending lip 90 of the second shield segment 80 so that the second shield segment 80 is supported on the inwardly extending lip 86 of the first shield segment 74 when the lift pin assembly 70 is in the extended condition shown in FIG. 4A.

Similarly, the second shield segment also may have an inwardly extending lip 94 at a lower end 96 of the second shield segment 80. The third shield segment 82 may have an outwardly extending lip 98 at an upper end 100 of the third shield segment 82. The inwardly extending lip 94 of the second shield segment 80 may be adapted to engage the outwardly extending lip 98 of the third shield segment 82 so that the third shield segment 82 is supported on the inwardly extending lip 94 when the lift pin assembly 70 is in the extended condition shown in FIG. 4A.

Likewise, the third shield segment 82 also may have an inwardly extending lip 102 at a lower end 104 of the third shield segment 82. The fourth shield segment 84 may have an outwardly extending lip 106 at an upper end 108 of the fourth shield segment 84. The inwardly extending lip 82 of the third shield segment 84 may be adapted to engage the outwardly extending lip 106 of the fourth shield segment 84 so that the fourth shield segment 84 is supported on the inwardly extending lip 102 when the lift pin assembly 70 is in the extended condition shown in FIG. 4A.

The lift pin assembly 70 further may include a shield member 110 that is fixedly mounted in a floor 112 of a substrate processing chamber. The shield member 110 may have an upper section 114, a lower section 116 and a flange 118 that extends horizontally outwardly between the upper section 114 and the lower section 116. The flange 118 may be inset in the processing chamber floor 112. The shield member 110 has an inner perimeter that is dimensioned to accommodate the shaft 72, and to allow the shaft 72 to extend and retract (i.e., to lift and lower) while the shield member 110 remains stationary. The upper section 114 of the shield member 110 has an outer perimeter that is smaller than the perimeter of an adjacent shield segment (e.g., the fourth shield segment 84) so that the upper section 114 is accommodated within the fourth shield segment 84 when the lift pin assembly 70 is in the retracted position shown in FIG. 4B. When the lift pin assembly 70 is in the extended position shown in FIG. 4A, an upper end 120 of the upper section 114 of the shield member 110 extends above a lower end 122 of the adjacent shield segment (e.g., the fourth shield segment 84). Preferably the upper and lower sections of the shield member 110 are cylindrical.

In operation, the lift pin assembly 70 may be extended and retracted (raised and lowered) between the positions shown in FIGS. 4A and 4B to lift or lower a semiconductor substrate (not shown in FIGS. 4A and 4B). When the lift pin assembly 70 is in the extended position shown in FIG. 4A, cleaning fluid or other liquids present in the substrate processing chamber flow down the outside of the first shield segment 74, the second shield segment 80, the third shield segment 82, the fourth shield segment 84 and the upper cylindrical section 114 of the shield member 110 to the flange 118 of the shield member 110 and the processing chamber floor 112. In this manner, the liquid is prevented from reaching the shaft 72, and from flowing down the shaft 72 through the floor 112, to possibly damage components of the substrate processing apparatus that are below the floor 112. When the lift pin assembly 70 is in the retracted condition shown in FIG. 4B, the liquid may flow along the outside of the first shield segment 74 directly to the floor 112 and again is prevented from reaching the shaft 72.

The inventive lift pin assembly of FIGS. 4A and 4B, is particularly useful when the lift pin shaft has vertical notches or grooves, as might be required for the pin coupling mechanism described with reference to FIG. 2. It may be difficult to seal such notched or grooved shafts with an O-ring or the like at the chamber floor. Thus, the arrangement of the telescoping shield segments of FIGS. 4A and 4B, with the optional shield member, prevents liquid from reaching the shaft and penetrating through the processing chamber floor. It will be understood that rather than employing a shield member, the shield segments may extend to the floor of the chamber. In such an embodiment the floor of the processing chamber may optionally be slanted so that fluid is directed away from the lift pin aperture.

The foregoing description discloses only the preferred embodiments of the invention; modifications of the above disclosed apparatus and methods which fall within the scope of the invention will be readily apparent to those of ordinary skill in the art. For example, the inventive lift pin assembly of FIGS. 4A and 4B may be used with or without the substrate centering mechanism of FIGS. 1A-3. Moreover, although the lift pin assembly of FIGS. 4A and 4B is shown as including four telescoping shield segments, more or fewer than four shield segments may be employed in the inventive lift pin assembly.

The three inner shield segments of the inventive lift pin assembly are shown as having substantially the same height as the inner height of the largest (outer) shield segment.

Alternatively, however, one or more of the inner shield segments may have a height that is less than the inner height of the outer shield segment.

The inventive lift pin assembly, and the substrate support pins of the inventive substrate centering mechanism, are shown herein as having a substantially flat top surface (except for the centering tabs provided on the substrate support pin's upper surfaces). However, the upper surfaces of the substrate support pins and/or the lift pin assembly may be rounded or dome-shaped, etc., to more readily shed liquid that may impinge on the upper surface of the substrate support pins and/or the lift pin assembly. Furthermore, the upper surface may be adapted (e.g., may include a projection such as a radiused contact point, etc.) which provides a limited area of contact with the lower surface of the substrate.

The substrate centering mechanism of FIGS. 1A-3 is shown as including three rotatable substrate support pins. However, other numbers of rotatable substrate support pins may be employed in the inventive substrate centering mechanism. For example, when centering substrates having flats four or five rotatable substrate support pins may be preferred.

The inventive substrate centering mechanism has been illustrated in the context of a substrate bevel cleaning apparatus. It is, however, also contemplated to employ the inventive substrate centering mechanism in other types of substrate processing chambers (e.g., spin rinsers for cleaning a substrate's major surface, etch or deposition chambers, or any chamber in which wafer centering is desired, etc.), or in conjunction with substrate handling equipment that is not part of a substrate processing chamber.

The inventive substrate centering mechanism has been illustrated herein in conjunction with substrate support pins that also lift and lower the substrate. However, it is also contemplated to implement the inventive substrate centering mechanism in conjunction with pins that are stationary in the vertical direction (i.e., do not lift or lower) in which case, a substrate support may lift and lower relative to the stationary pins. Similarly, although described with reference to centering a disk shaped substrate, the invention may be used to center substrates having other shapes, including rectangular or square substrates, etc.

Accordingly, while the present invention has been disclosed in connection with the preferred embodiments thereof, it should be understood that other embodiments may fall within the spirit and scope of the invention, as defined by the following claims.

The invention claimed is:

1. An apparatus for supporting and centering a substrate, comprising:
   a substrate chuck having:
   a plurality of pins, each pin having a top surface and a longitudinal axis of rotation, the top surfaces of the pins defining a plane in which the substrate is supported, each pin having a tab mounted eccentrically with respect to the pin's longitudinal axis of rotation at the top surface of the pin and extending upwardly relative to the top surface of the pin; and
   a pin rotation mechanism adapted to rotate each pin about a longitudinal axis of the respective pin, the pin rotation mechanism rotating the pins between a first position in which the tabs define an envelope that is larger than a circumference of the substrate and a second position in which the tabs define a centered position for the substrate.

2. The apparatus of claim 1, further comprising a fluid dispenser positioned relative to the substrate chuck so as to direct fluid to a substrate supported thereby;
   wherein the fluid dispenser is positioned relative to the substrate chuck so as to direct fluid toward an edge of a substrate supported thereon.

3. The apparatus of claim 1 wherein the pin rotation mechanism includes:
   a plurality of pin rotation mechanisms each mounted concentrically with respect to one of the pins, and
   a central transmission mechanism adapted to simultaneously transfer rotary motion to each of the plurality of pins.

4. The apparatus of claim 3 wherein the substrate chuck has a central axis of rotation, and the central transmission mechanism is mounted on the substrate chuck's central axis of rotation.

5. The apparatus of claim 3 wherein the plurality of pin rotation mechanisms comprises a plurality of sprockets, and wherein the central transmission mechanism comprises a gear which meshes with each of the plurality of sprockets.

6. The apparatus of claim 5, wherein the gear has a hole formed therein concentric with an axis of rotation of the gear, the hole being sized to accommodate a spindle for a rotary chuck.

7. The apparatus of claim 3 wherein each lift pin further comprises a mechanism for preventing lift pin rotation relative to the respective pin rotation mechanism.

8. The apparatus of claim 7 wherein the mechanism for preventing lift pin rotation comprises a spline and a guide through which the spline lifts and lowers.

9. The apparatus of claim 1 further comprising:
   a pin lift/lower mechanism adapted to move the pins along the longitudinal axes of the pins; and
   a controller operatively coupled to the pin rotation mechanism and the pin lift/lower mechanism and adapted to control the pin rotation mechanism and the pin lift/lower mechanism such that the pin rotation mechanism rotates the pins from the first position to the second position while the pin lift/lower mechanism is lowering the pins.

10. An apparatus for supporting and centering a substrate, comprising:
    a substrate chuck having:
    a plurality of pins, each pin having a top surface and a longitudinal axis of rotation, the top surfaces of the pins defining a plane in which the substrate is supported, each pin having a tab mounted eccentrically with respect to the pin's longitudinal axis of rotation at the top surface of the pin and extending upwardly relative to the top surface of the pin;
    a pin rotation mechanism adapted to rotate each pin about a longitudinal axis of the respective pin, the pin rotation mechanism rotating the pins between a first position in which the tabs define an envelope that is larger than a circumference of the substrate and a second position in which the tabs define a centered position for the substrate;
    a pin lift/lower mechanism adapted to move the pins along the longitudinal axes of the pins; and
    a controller operatively coupled to the pin rotation mechanism and the pin lift/lower mechanism and adapted to control the pin rotation mechanism and the pin lift/lower mechanism such that the pin rotation mechanism rotates the pins from the first position to the second position while the pin lift/lower mechanism is lowering the pins.

11. An apparatus for supporting and centering a substrate, comprising:
- a plurality of pins, each pin having a top surface and a longitudinal axis of rotation, the top surfaces of the pins defining a plane in which the substrate is supported, each pin having a tab mounted eccentrically with respect to the pin's longitudinal axis of rotation at the top surface of the pin and extending upwardly relative to the top surface of the pin; and
- a pin rotation mechanism adapted to rotate each pin about a longitudinal axis of the respective pin, the pin rotation mechanism rotating the pins between a first position in which the tabs define an envelope that is larger than a circumference of the substrate and a second position in which the tabs define a centered position for the substrate.

12. The apparatus of claim 11, further comprising:
a pin lift/lower mechanism adapted to move the pins along the longitudinal axes of the pins.

13. The apparatus of claim 12, further comprising:
a controller operatively coupled to the pin rotation mechanism and the pin lift/lower mechanism and adapted to control the pin rotation mechanism and the pin lift/lower mechanism such that the pin rotation mechanism rotates the pins from the first position to the second position while the pin lift/lower mechanism is lowering the pins.

14. A method of centering a substrate, comprising:
supporting the substrate on a plurality of pins; and
rotating each pin about a longitudinal axis of the pin to bring a tab on each pin in contact with the substrate.

15. The method of claim 14, wherein each pin is rotated substantially 90°.

16. The method of claim 14, further comprising:
lowering the substrate, via the plurality of pins, onto a chuck after the rotating step.

17. The method of claim 16, further comprising:
lowering the substrate during the rotating step.

18. The method of claim 14, further comprising:
moving the substrate in a vertical direction during the rotating step.

19. The method of claim 18, wherein the moving step includes lowering the substrate.

20. The method of claim 18, wherein the moving step includes lifting the substrate.

21. A method of centering a substrate, comprising:
supporting the substrate on a plurality of pins; and
rotating each pin about a longitudinal axis of the pin to bring a tab on each pin into proximity with an edge of the substrate to thereby center the substrate.

22. The method of claim 21, wherein each pin is rotated substantially 90°.

23. The method of claim 21, further comprising:
lowering the substrate, via the plurality of pins, onto a vacuum chuck after the rotating step.

24. The method of claim 21, further comprising:
moving the substrate in a vertical direction during the rotating step.

25. A method of centering a substrate, comprising:
supporting the substrate on a plurality of pins;
rotating each pin in a first direction about a longitudinal axis of the pin to bring a tab on each pin into contact with the substrate; and
rotating each pin in a second direction that is opposite to the first direction to move the tabs out of contact with the substrate, leaving the substrate in a centered position.

26. The method of claim 25, further comprising:
lowering the substrate, via the plurality of pins, onto a chuck after the second rotating step.

27. The method of claim 26, further comprising:
lowering the substrate during at least one of the rotating steps.

28. The method of claim 27, wherein the substrate is lowered during both of the rotating steps.

29. The method of claim 25, wherein each pin is rotated less than 1° during the second rotating step.

30. The method of claim 28, further comprising:
lowering the substrate during at least one of the rotating steps.

* * * * *